United States Patent [19]

Miller

[11] Patent Number: 4,725,765
[45] Date of Patent: Feb. 16, 1988

[54] METHOD AND APPARATUS FOR THE PROTECTION OF D.C. MOTORS UNDER STALLED CONDITIONS

[75] Inventor: John M. Miller, Dearborn, Mich.

[73] Assignee: Ford Motor Company, Dearborn, Mich.

[21] Appl. No.: 799,664

[22] Filed: Nov. 18, 1985

[51] Int. Cl.$^4$ .............................................. H02K 17/34
[52] U.S. Cl. .................................... 318/434; 361/28; 361/31; 361/93
[58] Field of Search ............... 318/434, 430, 432, 433, 318/565; 361/23, 28, 31, 30, 29, 93, 94

[56] References Cited

U.S. PATENT DOCUMENTS

| | | | |
|---|---|---|---|
| 3,803,454 | 4/1974 | Higuchi | 361/31 |
| 3,931,557 | 1/1976 | Osburn | 318/434 |
| 4,084,119 | 4/1978 | Kato | 318/434 |
| 4,150,324 | 4/1979 | Naito | 318/139 |
| 4,260,938 | 4/1981 | Joyes | 318/434 |
| 4,286,303 | 8/1981 | Genheimer | 361/31 X |
| 4,288,828 | 9/1981 | Kunter | 318/430 |
| 4,322,668 | 3/1982 | Trussler et al. | 318/434 |
| 4,433,370 | 2/1984 | Karadsheh et al. | 363/124 |
| 4,439,806 | 3/1984 | Brajder | 361/98 |
| 4,473,856 | 9/1984 | Takahashi | 361/31 |
| 4,477,758 | 10/1984 | De Biasi | 361/31 X |
| 4,509,088 | 4/1985 | Profio | 361/31 X |
| 4,547,715 | 10/1985 | Li | 361/31 X |

Primary Examiner—William M. Shoop, Jr.
Assistant Examiner—Patrick C. Keane
Attorney, Agent, or Firm—Paul K. Godwin, Jr.; Clifford L. Sadler

[57] ABSTRACT

A technique for detecting the occurrence of stall currents in a D.C. motor control circuit and inhibiting the application of drive currents to the motor by monitoring the current flow through the motor and responding to stall currents that are continuous for a predetermined period of time.

5 Claims, 2 Drawing Figures

METHOD AND APPARATUS FOR THE PROTECTION OF D.C. MOTORS UNDER STALLED CONDITIONS

BACKGROUND OF THE INVENTION

1. Field of the Invention

The present invention is directed to the field of D.C. motors and more specifically to the area of providing stall protection for such motors.

2. Description of the Prior Art

Numerous solutions have been proposed for limiting the effects of stalling currents in D.C. motors and associated control circuitry.

For instance, some solutions utilize pulse generators (tachometers) which are connected to the shafts of D.C. motors and provide output signals that are fed back to the respective motor control circuits. At such time that a motor is slowed to a stall condition, the drive current for the motor is suspended by its control circuit.

Other techniques to prevent stall current damage have utilize thermal circuits that disconnect motor power when the stall currents occur for a period of time.

SUMMARY OF THE INVENTION

The present invention is intended to provide both method and apparatus for detecting the stalled condition of a D.C. motor and inhibiting the application of power to the motor for predetermined periods of time to lessen the detrimental effects of the excessive stall current on the drive control circuit of the motor.

In the illustrated embodiment, start current, for a D.C. motor under load, normally reaches a level which is in the range of that which would be reached under stall current levels, but for a relatively short duration. Accordingly, the present invention provides a method and apparatus which only causes inhibiting of the motor power when a stall current level is continuous for a period of time greater than that which should occur during motor start.

The invention comprises a circuit which includes means for selectively applying D.C. voltage to the motor, combined with means for sensing the level of current flow through the D.C. motor and responsively providing an output voltage having a level corresponding to the sensed current. The circuit also includes means for establishing a first reference voltage level corresponding to a level of output voltage that is well above a level corresponding to the sensed current through the D.C. motor in its normal run condition and slightly below a level corresponding to the sensed current through the D.C. motor in a stalled condition. Other means compare the output voltage with the first reference voltage level and produce a stall signal whenever the output voltage is greater than the first reference voltage level. Means are also included for timing the occurrence of the stall signal and producing a blanking signal of a predetermined duration whenever the stall signal is continuous for a first predetermined period of time. Gating means are responsive to the blanking signal for inhibiting the application of D.C. voltage to the motor for the duration of the blanking signal.

In the circuit, a second reference voltage level is established which is less than the first reference voltage level and slightly above a level of output voltage that corresponds to the sensed current through the D.C. motor in its run condition. Another means compares the output voltage with the second reference voltage level and produces a run signal whenever the output voltage is greater than the second reference signal. Means responsive to the initial portion of the stall signal outputs a delay timing pulse having a duration equal to the first predetermined period of time. A bistable latching means having a set state and a reset state is responsive to the end portion of the delay timing pulse to assume its set state and to the initial portion of the run signal to assume its reset state. Gating means are provided so as to be responsive to the simultaneous occurrence of the stall signal and the output of the bistable means in its set state for commencing the generation of the blanking signal.

The circuit thereby functions to distinguish when stall currents are present for an excessive time period and responsively inhibit the application of drive power to the motor control drive circuit for a period of time. Such sensing and inhibiting is repeatedly continued until stall currents or drive command voltages are no longer present. This repetition effectively reduces the duty cycle of power applied to the motor control circuit from 100% to an acceptable level below 25%.

DETAILED DESCRIPTION OF THE PREFERRED EMBODIMENT

Figure 1:
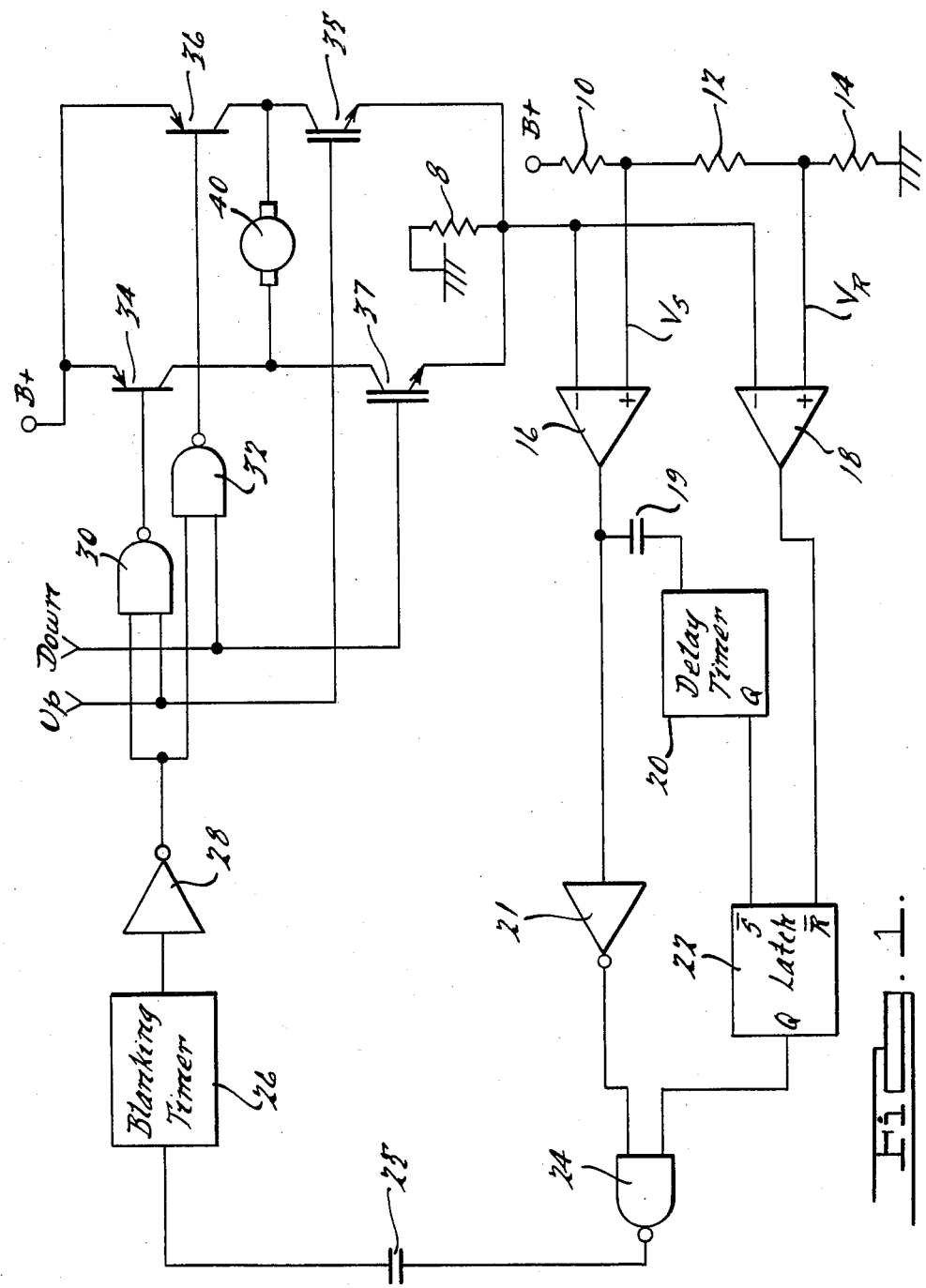
FIG. 1 is a circuit diagram illustrating a preferred embodiment of the present invention.

The preferred embodiment of the invention is provided in FIG. 1, in combination with a control circuit for an electric window drive motor in an automotive vehicle. The D.C. motor 40 is reversible in rotation direction, depending on the direction of the current flow through the motor windings.

Power transistors 34, 35, 36 and 37, along with buffer gates 30 and 32 comprise the control circuit for the D.C. motor 40 in this embodiment.

Power transistors 34 and 35 are connected so as to energize the motor 40 for rotation in a first direction when they are both biased to their conducting states. Likewise, power transistors 36 and 37 are connected to energize the motor 40 for rotation in the opposite direction when those power transistors are biased in their conducting states.

Buffer NAND gates 30 and 32 are provided to respectively switch PNP power transistors 34 and 36 to their "on" (conducting) or off (non-conducting) states.

One input to NAND gate 30 is connected to a conventional "UP" control switch (not shown) that is operator actuated to provide a D.C. operating voltage to that input of NAND gate 30. The control voltage from the UP switch is also connected to directly bias an n-channel power MOSFET 35 to its on state (transistors 35 and 37 are shown as insulated gate transistors which contain internal diodes for reverse voltage (B+) protection of the power electronics). The other input to NAND gate 30 is normally at a relatively high level from an inverter 28 so that each actuation of the UP control switch will be communicated to the transistor 34 for biasing it in its on state concurrently with the biasing on of power MOSFET 35.

Similarly, NAND gate 32 is connected to the base of PNP power transistor 36 in order to control its biasing. One input of the NAND gate 32 is connected to a conventional DOWN control switch (not shown) that provides operating voltage when actuated by the operator. The DOWN switch is directly connected to the base of the power MOSFET 37 so that when the DOWN switch is actuated, both transistors 36 and 37 are biased to their on states to drive the motor 40 in its opposite direction of rotation.

In order to protect the transistorized control circuit of the motor 40 from prolonged high current when the motor 40 is overloaded and reaches its stalled condition, the present invention distinguishes between high current of short duration that occurs during the start of the motor and those high currents which occur during stall and appropriately inhibits the application of drive current through the power transistors.

Figure 2:
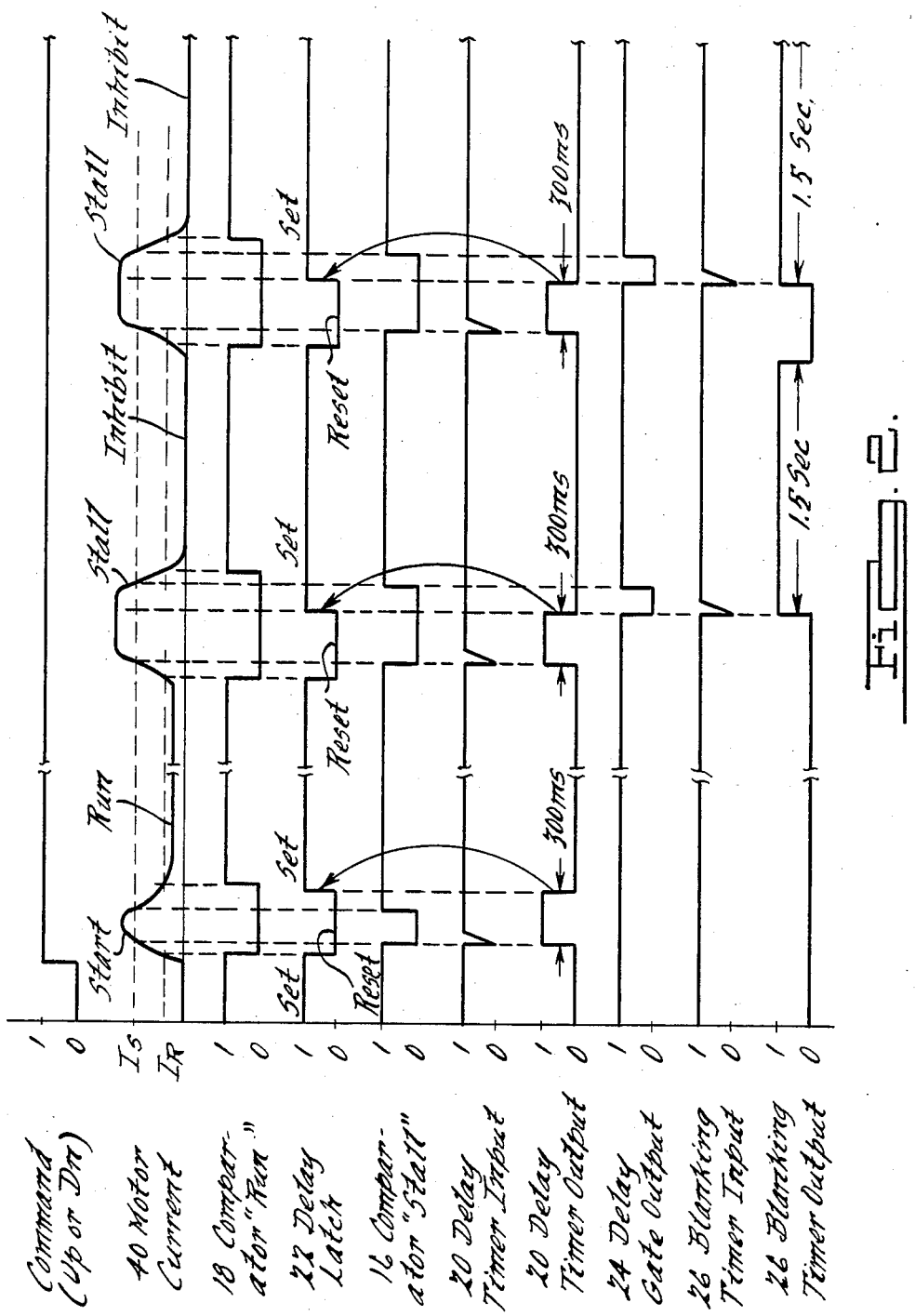
FIG. 2 illustrates a plurality of waveforms which occur in the circuit of FIG. 1.

The following description makes concurrent reference to FIGS. 1 and 2, since FIG. 2 provides waveforms to illustrate signals occurring at specific points in the circuit shown in FIG. 1.

In the protection circuit of FIG. 1, a voltage divider circuit is shown, which includes resistors 10, 12 and 14 in series, connected across a 12 volt D.C. power supply (not shown). The voltage divider provides predetermined reference voltage levels $V_R$ and $V_S$. $V_S$ is selected as being slightly below the voltage level that would appear at resistor 8 if the motor were in a stalled condition. $V_R$ is selected as being below $V_S$ and slightly above the voltage level that would appear at resistor 8 when the motor is in its normal run (operating) condition.

A "run" comparator circuit 18 is connected to receive the reference voltage $V_R$ on its positive input terminal. A "stall" comparator 16 is connected to receive the reference voltage $V_S$ on its positive input terminal. The negative input terminals of the comparators 16 and 18 are commonly connected to the emitters of power MOSFETS 35 and 37 which are connected through resistor R8 to ground.

The run comparator 18 provides an output signal change from a relatively high to low level when the voltage drop across resistor 8 exceeds the reference voltage $V_R$. A delay latch circuit 22 is reset by such a change in the output of comparator 18 to provide a low level Q output.

The output of the stall comparator 16 is connected through an inverter 21 to one input of a NAND gate 24 and a capacitor 19. The other side of the capacitor 19 is connected to the input of a delay timer 20. The delay timer 20 reacts to a negative going pulse input across the capacitor 19, which reflects the leading edge of the change in output of the stall comparator 16 when voltage drop across resistor 8 changes to exceed the reference voltage $V_S$, by providing a Q output after a predetermined period of time (300 ms).

The Q output of the delay latch 22 is provided to the other input of NAND gate 24. The output of NAND gate 24 is connected to a capacitor 25. The other side of the capacitor 25 is connected to a blanking timer circuit 26. The blanking timer 26 is responsive to a negative going pulse, such as occurs when the output of NAND gate 24 switches from a high level output to a low level output, and provides a high level blanking pulse of a predetermined duration (1.5 seconds) to the inverter 28. The effect of the inverter output 28, when receiving a blanking pulse from the blanking timer 26, is to inhibit both NAND gates 30 and 32 and thereby prevent energization of the control power transistors 34 and 36, during that blanking pulse.

Typically, in operation, the motor 40 will be energized in one direction in response to an UP or DOWN command. If, for instance, an UP command is given, transistors 34 and 35 are biased in their on states while transistors 36 and 37 are held in their off states. Current flows through transistor 34, motor 40, transistor 5 and resistor 8 to ground. As shown in FIG. 2, when the motor initially starts, the current draw rapidly increases from 0 to a peak and then immediately falls off to a normal run level. However, when the motor reaches a stall condition, the current again immediately increases to a high level which, if prolonged, would cause damage to the power transistors. The present invention is provided to differentiate between a start condition of the motor under load in which the high current is drawn for a relatively short time period and a stall condition and to provide appropriate inhibiting of the power transistors.

As shown in FIG. 2, a level of current $I_R$ through the motor 40 is defined slightly above the normal run condition of the motor. A second current level $I_S$ is determined as being slightly below the level at which the motor reaches its stalled condition. Reference voltages $V_R$ and $V_S$ are provided to correspond to the voltage drop across resistor 8 whenever the respective current levels $I_R$ and $I_S$ are reached.

In order for a blanking pulse to be produced by the blanking timer output 26, the delay NAND gate 24 must have both inputs at a high level. Such a situation is only achieved when the motor current has increased from below $I_R$ to above an $I_S$ level. That sequence causes run comparator 18 to reset the latch 22 and causes the stall comparator 16 to subsequently trigger the delay timer 20. After the delay timer 20 has timed out for approximately 300 milliseconds, it sets the delay latch 22. The delay latch 22 then provides a high level Q output to NAND gate 24. The function of the delay timer 20 is to compensate for those times when the motor current exceeds the $I_S$ level during the start mode of operation, which is predicted to be less than the 300 millisecond period. If, in the case of a stalled condition, the output of the comparator 16 continues to provide a low level output after the 300 millisecond time delay, both inputs to the delay NAND gate 24 will be at a high level and thereby provide the appropriate command to the blanking timer 26 to commence its inhibiting of the control circuit.

The blanking pulse will periodically be reapplied as long as the motor remains stalled to thereby lower the duty cycle on the power transistors from 100% to approximately 17%, in the disclosed embodiment.

The components shown and described in the preferred embodiment are commercially available and designated as follows:

Blanking Timer 26—Type 555 timer I.C.
Delay Timer 20—Type 555 timer I.C.
Stall Comparator 16—Type LM 339 I.C.
Run Comparator 18—Type LM 339 I.C.
NAND gate 24—Type 74C00 I.C.
Latch 22—Type 74C00 I.C.
NAND gates 30 to 32—DS132 Buffer gates I.C.
Inverters 21 and 28—Type 74C901 I.C.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. A circuit for detecting the stalled condition of a D.C. motor comprising:

means for selectively applying D.C. voltage to said motor;

means for sensing the flow of current through said D.C. motor and providing an output voltage having a level corresponding to said sensed current;

means for establishing a first reference voltage level corresponding to a level of output voltage that is above a level corresponding to the sensed current through said D.C. motor in its normal run condition and below a level corresponding to the sensed current through said D.C. motor in its stalled condition;

means for comparing said output voltage with said first reference voltage level and producing a stall signal whenever said output voltage is greater than said first reference voltage level;

means for timing the occurrence of said stall signal and producing a blanking signal of a predetermined duration whenever said stall signal is continuous for a first predetermined period of time; and means responsive to said blanking signal for inhibiting the application of D.C. voltage to said motor for the duration of said blanking signal, wherein said timing means includes:

means for establishing a second reference voltage level which is less than said first reference voltage level and above a level of output voltage that corresponds to the sensed current through said D.C. motor in its normal run condition;

means for comparing said output voltage with said second reference voltage level and producing a run signal whenever said output signal is greater than said second reference signal;

means responsive to the initial portion of said stall signal and providing a delay timing pulse having a duration equal to said first predetermined period of time;

bistable means having a set state and a reset state respectively responsive to the end portion of said delay timing pulse and the initial portion of said run signal; and gating means responsive to the simultaneous occurrence of said stall signal and said bistable means in its set state for commencing the generation of said blanking signal.

2. A circuit as in claim 1, wherein said timing menas further includes a means connected between said gating means and said inhibiting means for generating said blanking signal for a predetermined period of time.

3. A circuit as in claim 2, wherein said first predetermined period of time is approximately 300 miliseconds and the duration of said blanking pulse is at least 1.5 seconds.

4. A method of automatically protecting a D.C. motor against excessive current in its stalled condition, comprising the steps of:

defining means for selectively applying D.C. voltage to said motor;

sensing the flow of electrical current through said D.C. motor;

providing an output voltage corresponding in value to said sensed current;

establishing a first reference voltage level corresponding in value to a level of output voltage that is above a level corresponding to the sensed current through said D.C. motor in its normal run condition and below a level corresponding to the sensed current through said D.C. motor in its stalled condition;

comparing said output voltage with said first reference voltage;

producing a stall signal whenever said step of comparing indicates said output voltage exceeds said first reference voltage;

timing the occurrence of said stall signal over a first predetermined period of time;

establishing a second reference voltage level which is below said first reference voltage level and above a level of output voltage that corresponds to the sensed current through said D.C. motor in its normal run condition;

comparing said output voltage with said second reference voltage;

producing a run signal whenever said second step of comparing indicates said output voltage exceeds said second reference voltage;

providing a delay timing pulse for a duration equal to said first predetermined period of time in response to the initial portion of said stall signal;

providing a bistable means having a set state and a reset state connected to receive and being respectively responsive to the end portion of said delay timing pulse and to the initial portion of said run signal;

producing a blanking signal for a second predetermined duration only when said bistable means is in its said set state and said stall signal is present at the end of said first predetermined period of time, and inhibiting the application of said D.C. voltage to said motor for the duration of said blanking signal.

5. A method as in claim 4, wherein said delay timing pulse is produced for approximately 300 miliseconds and said blanking signal is produced for at least 1.5 seconds.

* * * * *